(12) United States Patent
Shen

(10) Patent No.: US 10,209,542 B1
(45) Date of Patent: Feb. 19, 2019

(54) SYSTEM AND METHOD OF EMBEDDING DRIVER IC (EMDIC) IN LCD DISPLAY SUBSTRATE

(71) Applicant: DiDrew Technology (BVI) Limited, San Jose, CA (US)

(72) Inventor: Minghao Shen, San Jose, CA (US)

(73) Assignee: DIDREW TECHNOLOGY (BVI) LIMITED, San Jose, CA (US)

(*) Notice: Subject to any disclaimer, the term of this patent is extended or adjusted under 35 U.S.C. 154(b) by 0 days.

(21) Appl. No.: 15/958,797

(22) Filed: Apr. 20, 2018

Related U.S. Application Data

(60) Provisional application No. 62/599,568, filed on Dec. 15, 2017.

(51) Int. Cl.
| | |
|---|---|
| G02F 1/1345 | (2006.01) |
| G02F 1/133 | (2006.01) |
| G02F 1/1335 | (2006.01) |
| G02F 1/1368 | (2006.01) |
| H05K 1/18 | (2006.01) |
| G02F 1/1362 | (2006.01) |
| H01L 27/12 | (2006.01) |
| G09G 3/36 | (2006.01) |

(52) U.S. Cl.
CPC ........ G02F 1/13306 (2013.01); G02F 1/1368 (2013.01); G02F 1/13454 (2013.01); G02F 1/133514 (2013.01); G02F 1/136286 (2013.01); G09G 3/36 (2013.01); H01L 27/124 (2013.01); H05K 1/189 (2013.01)

(58) Field of Classification Search
CPC ............. G02F 1/13454; G02F 1/13458; G02F 2001/13456
See application file for complete search history.

(56) References Cited

U.S. PATENT DOCUMENTS

| | | |
|---|---|---|
| 5,379,942 A | 1/1995 | Kuhnert |
| 5,436,745 A | 7/1995 | Voisin |
| 5,822,030 A | 10/1998 | Uchiyama |
| 6,456,353 B1 | 9/2002 | Chen |
| 6,885,032 B2 | 4/2005 | Forbes |
| 7,002,809 B2 | 2/2006 | Lee |
| 7,839,469 B2 | 11/2010 | Wu |
| 8,044,464 B2 | 10/2011 | Yamazaki |

(Continued)

OTHER PUBLICATIONS

Chip-On-Glass (COG) for LCD Modules, NXP.

(Continued)

*Primary Examiner* — Phu Vu
(74) *Attorney, Agent, or Firm* — LeClairRyan

(57) ABSTRACT

Disclosed is a display module and method of manufacturing the same, where the display module comprises a LCD panel, a driver IC for driving the LCD panel, and a FPC electrically coupled to the driver IC. The LCD panel includes an array of TFT pixels on a TFT array substrate. The TFT array substrate defines a driver cavity in which the driver IC is disposed. The driver IC includes an interface side and an opposing non-interface side. The interface side includes an image signal input pad and a driving signal output pad. The driver IC is configured to receive image signals from the FPC, to process the image signals into drive signals, and to transmit the drive signals to one or more of the plurality of TFT pixels via an RDL electrical connection.

20 Claims, 3 Drawing Sheets

(56) References Cited

U.S. PATENT DOCUMENTS

| | | |
|---|---|---|
| 8,048,358 B2 | 11/2011 | Takano |
| 8,513,124 B1 | 8/2013 | Ponnuswamy |
| 9,381,732 B2 | 7/2016 | Lindner et al. |
| 9,449,935 B1 | 9/2016 | Shih et al. |
| 9,502,323 B2 | 11/2016 | Jang et al. |
| 9,547,208 B2 | 1/2017 | Grip |
| 9,664,932 B2 * | 5/2017 | Nishino ................ G02F 1/1309 |
| 9,679,785 B2 | 6/2017 | Chinnusamy |
| 9,766,518 B2 | 9/2017 | Fujikawa |
| 9,911,672 B1 | 3/2018 | Wu et al. |
| 2008/0182363 A1 | 7/2008 | Amrine |
| 2008/0268618 A1 | 10/2008 | Yamazaki |
| 2011/0316156 A1 | 12/2011 | Pagaila |
| 2012/0000613 A1 | 1/2012 | Thallner |
| 2012/0217643 A1 | 8/2012 | Pagaila |
| 2014/0061893 A1 | 3/2014 | Saeidi |
| 2014/0175637 A1 | 6/2014 | Stuber et al. |
| 2016/0238862 A1 * | 8/2016 | Nishino ................ G02F 1/1309 |
| 2017/0018450 A1 | 1/2017 | Tang |
| 2017/0200647 A1 | 7/2017 | Stering |
| 2018/0040489 A1 | 2/2018 | Fehkuhrer |
| 2018/0076142 A1 | 3/2018 | Shim et al. |

OTHER PUBLICATIONS

Matope, S. et al. "Silver, Copper and Aluminium Coatings for Micro-Material Handling Operations", South African Journal of Industrial Engineering, Aug. 2013, vol. 24(2), pp. 69-77.

* cited by examiner

SYSTEM AND METHOD OF EMBEDDING DRIVER IC (EMDIC) IN LCD DISPLAY SUBSTRATE

RELATED APPLICATION

The present application claims priority to U.S. Provisional Application No. 62/599,568 filed Dec. 15, 2017, entitled "Embedded Driver IC (EmDIC) in LCD Display" which is incorporated herein by reference in its entirety.

FIELD OF THE INVENTION

The present disclosure relates generally to electronic devices and, more particularly, to electronic devices with displays.

BACKGROUND

Many different types of electronic devices include an electronic visual display that can provide visual information to a user. For example, a liquid-crystal display (LCD) is a widely used type of display that can be found is a wide range of electronic devices, including digital cameras, watches, calculators, and mobile telephones, including smartphones. An LCD is a flat-panel display that is often a desirable display option for several reasons, which may include that LCDs are relatively thin, light-weight, and efficient in terms of power consumption. In addition, the LCDs are known to have high resolution, high color display, and high definition.

The LCD in most electronic devices is part of an LCD module that has an LCD panel and a built-in driving circuit unit. The LCD panel typically includes a thin-film transistor (TFT) array substrate, a color filter substrate, a liquid crystal layer located between the TFT array substrate and the color filter substrate, and a backlight assembly disposed under the LCD panel to serve as a light source. The driving circuit unit typically includes an LCD Driver Integrated Circuit (driver IC) disposed at an outer ring of the LCD panel to drive the LCD panel. The LCD panel includes pixels in a matrix shape between two glass substrates (the TFT array substrate and the color filter substrate mentioned above) with a switching device for controlling signals respectively supplied to the pixels, like a thin-film transistor. A plurality of pixels are disposed between the two glass substrates in a matrix pattern on the TFT array substrate. A switching element, such as a TFT, is provided for each pixel for controlling drive signals to the respective pixel.

The driving circuit unit includes the above-mentioned driver IC, as well as a printed circuit board (PCB) on which driving circuits are provided for generating various signals for driving the LCD panel, such as control signals, clock signals, and data signals. The driver IC is connected to the LCD panel and the PCB to apply a signal to the TFTs, storage capacitors, pixel electrodes, and interconnect wiring of the LCD panel. The interconnect wiring includes gate bus-lines and data bus-lines arranged so that each pixel is individually addressable by the driving circuit unit. The driver IC includes a set of bonding pads with each bonding pad including a metal bump. The surface to which the driver IC is to be mounted is provided with a matching set of pads. The driver IC is mounted on the surface by bonding the set of bonding pads to the matching set of pads.

Chip On Glass (COG) and Chip On Film (COF) are two common methods for mounting a driver IC and connecting it to control an LCD panel. COG is a flip-chip bonding technology where the driver IC is mounted to a non-display region of the LCD panel's array substrate using Anisotropic Conductive Film (ACF). COF is also a flip-chip bonding technology, but the driver IC is mounted to a flexible printed circuit board (FPC), which in turn is mounted to a non-display region of the LCD panel's array substrate. This is undesirable because it results in LCD modules and LCD panels that have an overall footprint that is larger than that the actual display and dead edge regions that get covered for aesthetic reasons in the final product (e.g., smartphone or tablet computer).

FIGS. 1 and 2 illustrate an example of the non-display region caused by installation of a driver IC using a COG arrangement. FIG. 1 shows a perspective view of a display module 100, which illustrates an example of COG technology. The display module 100 includes an LCD panel 102 and a driver region 104, which includes a driver IC 112 (shown in FIG. 2). The FPC 106 for outputting image signals from a data processing device to the driver region 104. More particularly, the LCD panel 102 includes a TFT array substrate 108, liquid crystal (not shown), and a color filter substrate 110.

The TFT array substrate 108 includes a liquid crystal controlling part that is disposed in an active display area. The liquid crystal controlling part includes TFTs and pixel electrodes that are electrically connected to driving lines that are driven by the driver IC 112.

The color filter substrate 110 is opposite to the active display area of the TFT substrate 108. The color filter substrate 110 includes a color filter (not shown) and a common electrode (not shown). The color filter substrate 110 is positioned near the pixel electrodes and covered with a common electrode.

The manufacturing process includes injecting liquid crystal into a gap between the TFT array substrate 108 and the color filter substrate 110, thereby producing the LCD panel 102.

FIG. 2 shows a partial side view of the portion of the display module 100 near the driver IC 112. The driver IC 112 is a source driving integrated circuit package mounted on data lines. The driver IC 112 receives image signals from some outside source via the image signal input bumps 114, converts the received image signals into corresponding drive signals (e.g., voltage or current signal), and transmits the drive signals to the LCD panel 102 via the driving signal output bumps 116.

The image signal input bumps 114 are connected to conductive patterns 118, which are in turn connected to the FPC 106 via an anisotropic conductive film (ACF) 120. The driving signal output bumps 116 are connected to data lines 122 via the anisotropic conductive film 120. The TFT array substrate 108 supports the conductive patterns 120 and data lines 122, as shown.

Thus, while the use of the display module 100 provides the convenience of an LCD panel 102 with an integrated driver IC 112 with COG technology, the array substrate 108 is made larger than the filter substrate 110 and active display area in order to provide space for the driver IC 112.

It would therefore be desirable to be able to provide improved packaging technologies and display modules that provide high levels of integration and reductions in display dead space. The present disclosure provides novel packaging technologies that include such desired improvements.

BRIEF SUMMARY

According to some aspects of the present disclosure, a display module comprises a liquid crystal display (LCD)

panel, which in turn includes a thin-film transistor (TFT) array substrate, a color filter substrate facing the active side of the TFT array substrate, and a liquid crystal layer disposed between the TFT array substrate and the color filter substrate. The thin-film transistor (TFT) array substrate can include a plurality of TFT pixels and can define a driver cavity that extends from an active side of the TFT array substrate to a cavity bottom. The display module can further comprise a driver integrated circuit (driver IC) for driving the LCD panel, and a redistribution layer (RDL) on the TFT array substrate. The driver IC can be disposed in the driver cavity of the TFT array substrate. The driver IC can include an interface side and a non-interface side opposite the interface side, where the interface side includes an image signal input pad and a driving signal output pad. The RDL extends over at least a portion of the driver IC and provides at least one direct electrical connection between the driving signal output pad of the driver IC and at least one of the plurality of TFT pixels.

In some embodiments, the display module further comprises a display area and a non-display area, and the driver cavity is located in the non-display area.

In some embodiments, the driver cavity has one of a round, oval, square, and rectangular cross-sectional shape.

In some embodiments, the driver IC is positioned in the driver cavity such that the non-interface side of the driver IC faces the cavity bottom.

In some embodiments, the display module further comprises a layer of adhesive for bonding the driver IC in the driver cavity of the TFT array substrate. In some such embodiments, at least a portion of the layer of adhesive is disposed between the cavity bottom and the non-interface side of the driver IC.

In some embodiments, a flexible printed circuit (FPC) is mechanically coupled to the TFT array substrate, and wherein the FPC is electrically coupled to the driver IC.

In some embodiments, the FPC includes a plurality of electrical traces. In some such embodiments, at least one of the electrical traces is electrically connected to the image signal input pad of the driver IC.

According to other aspects of the invention, a method of manufacturing a display module comprises assembling a liquid crystal display (LCD) panel, which in turn includes forming a thin-film transistor (TFT) array substrate to have a driver cavity and a plurality of TFT pixels, the driver cavity including at least one sidewall extending into the TFT array substrate from an active side of the TFT array substrate to a cavity bottom; coupling a color filter substrate with the TFT array substrate such that the active side of the TFT array substrate faces the color filter substrate; and forming a liquid crystal layer between the TFT array substrate and the color filter substrate. The method of manufacturing the display module further comprises adhering a driver integrated circuit (driver IC) in the driver cavity; and forming a redistribution layer (RDL) on the active side of the TFT array substrate, where the forming of the RDL includes forming at least one electrical connection between the driver IC and at least one of the plurality of TFT pixels.

In some embodiments, the driver cavity is formed to have one of a round, oval, square, and rectangular cross-sectional shape.

In some embodiments, the driver IC includes an interface side and a non-interface side opposite the interface side. In some such embodiments, the driver IC is positioned in the driver cavity such that the non-interface side of the driver IC faces the cavity bottom, and the interface side includes an image signal input pad and a driving signal output pad. In some such embodiments, the forming of the RDL can include forming the RDL over at least a portion of the interface side of the driver IC, and the forming of the at least one electrical connection includes forming the at least one electrical connection between the driving signal output pad of the driver IC and at least one of the plurality of TFT pixels.

In some such embodiments, the adhering of the driver IC in the driver cavity can result in a gap between the driver IC and the at least one sidewall, and the forming of the RDL can include depositing a dielectric material over the driver IC and into the gap.

In some such embodiments, the method can further comprise etching away at least a portion of the RDL over the driver IC to expose the image signal input pad and the driving signal output pad. In some such embodiments, the method can further comprise attaching a flexible printed circuit (FPC) to the TFT array substrate, including forming at least one metal bump for electrically connecting the image signal input pad of the driver IC to the FPC.

According to further aspects of the invention, a display module comprises a liquid crystal display (LCD) panel having a plurality of TFT pixels and a thin-film transistor (TFT) array substrate. The TFT array substrate defines a driver cavity that extends into the TFT array substrate from an active side of the TFT array substrate to a cavity bottom. The display module also comprises a driver integrated circuit (driver IC) for driving the LCD panel, and a flexible printed circuit (FPC) electrically coupled to the driver IC. The driver IC is disposed in the driver cavity, where the driver IC includes an interface side and a non-interface side opposite the interface side, and where the interface side includes an image signal input pad and a driving signal output pad. Also, the image signal input pad is arranged to receive image signals from the FPC and the driving signal output pad is arranged to send driving signals to one or more of the plurality of TFT pixels.

In some embodiments, the driver cavity has one of a round, oval, square, and rectangular cross-sectional shape.

In some embodiments, the driver IC is positioned in the driver cavity such that the non-interface side of the driver IC faces the cavity bottom.

In some such embodiments, the display module further comprises a layer of adhesive for bonding the driver IC in the driver cavity of the TFT array substrate, and at least a portion of the layer of adhesive is disposed between the cavity bottom and the non-interface side of the driver IC.

In some embodiments, the display module further comprises a redistribution layer (RDL) on the TFT array substrate. In some such embodiments, the RDL provides at least one direct electrical connection between the driving signal output pad of the driver IC and at least one of the plurality of TFT pixels. In some such embodiments, the FPC includes a plurality of electrical traces, and at least one of the electrical traces is electrically connected to the image signal input pad of the driver IC.

DETAILED DESCRIPTION

Figure 1:
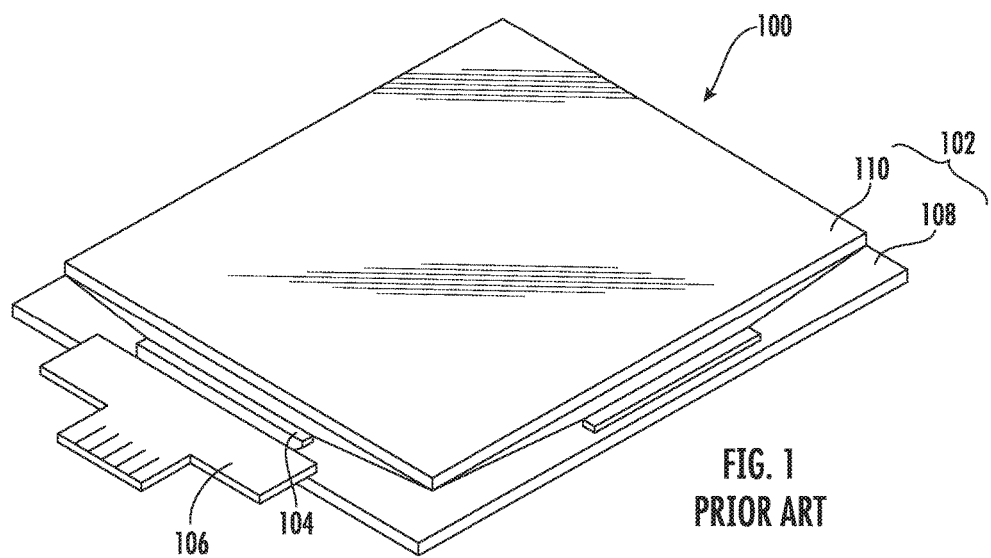
FIGS. 1 and 2 show perspective and side views, respectively, of an LCD display module.
Figure 2:
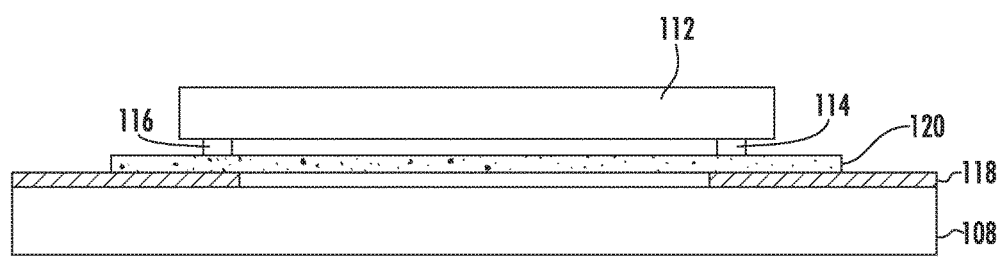

This disclosure relates to a liquid crystal module, and to methods for manufacturing a liquid crystal module having a driver integrated circuit (driver IC). Driver ICs are components of TFT-LCD panels that receive image data and deliver precise analog voltages or currents to an array of pixels on the TFT array substrate. When voltage is applied to the liquid crystal within each pixel, the liquid crystal is bent, thereby changing the intensity of light that passes through each individual pixel. Combined with the color filter on the front glass substrate, each pixel generates its own colors which, together with other pixels, make up the whole image on the panel.

Driver ICs for LCD panels include gate drivers and source drivers. Gate drivers turn on the transistor within each pixel cell on the horizontal row on the panel. When the transistors are turned on, source drivers will generate voltages that are applied to the liquid crystal within each pixel cell on that row for data input. The combination determines the colors generated by each pixel. Small-sized panel applications, such as mobile phones, will preferably include only a single source driver and a single gate driver, which are integrated into a single chip due to space and cost considerations.

The convenience of having a driver IC integrated into conventional LCD panels has helped to simplify the implementation of LCD technology into many different platforms, applications, and technology areas. However, the integrated driver IC has come at a cost because of the complexity and expense of manufacturing processes involved in the driver IC integration, in addition to the dead space (i.e., area of the LCD module footprint that cannot be used for displaying an image) resulting from mounting the driver IC and/or an FPC to the array substrate. The present disclosure includes improvements to LCD packaging technology that reduces the manufacturing cost of LCD modules and dead space associated with prior devices and manufacturing processes. For example, the present disclosure includes a driver cavity and driver IC arrangement, as well as other associated manufacturing processes, that eliminates the use of an anisotropic conductive film (ACF), reduces or eliminates surface traces on glass, reduces the number of Au bumps, and eliminates prior complex bonding between driver IC and FPC.

Many display and image-acquisition systems are, for various reasons, not capable of displaying or sensing the different color channels at the same site. Therefore, the pixel grid is divided into single-color regions that contribute to the displayed or sensed color when viewed at a distance. In some displays, these single-color regions are separately addressable elements and are sometimes referred to as subpixels. For example, LCDs typically divide each pixel vertically into three subpixels. However, for the sake of simplicity, this disclosure will simply refer to pixels with it being understood that references herein to pixels can apply equally to what are sometimes referred to as subpixels.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale.

Figure 3:
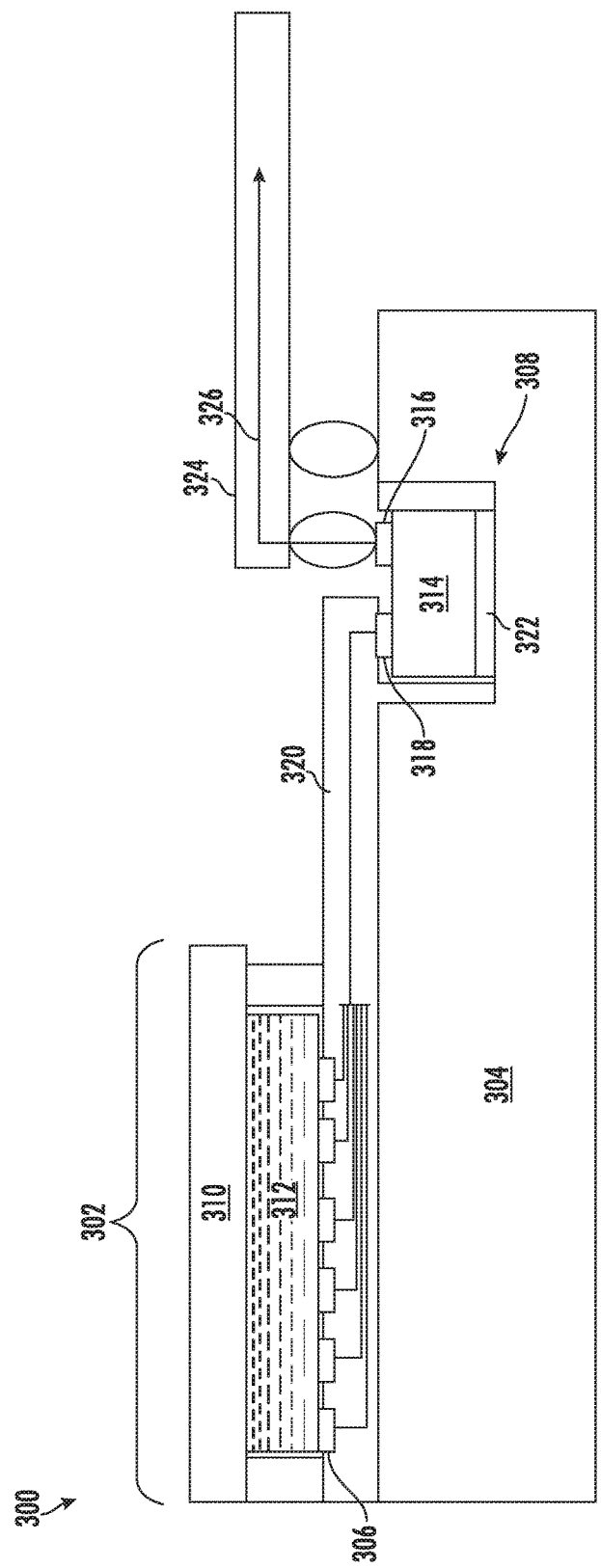
FIG. 3 shows a schematic, cross-sectional diagrams of an exemplary display module according to embodiments of the present disclosure.

FIG. 3 shows a schematic, cross-sectional diagram of an exemplary embodiment of an LCD module 300 according to the present disclosure. The LCD module 300 includes an LCD panel 302, a driver integrated circuit (driver IC) 314, and a flexible printed circuit (FPC) 324. In general, the typical operation of the LD module 300 would be as follows. The driver IC 314 would receive image data from some outside source via the FPC 324. The driver IC 324 would evaluate the received image data, generate corresponding LCD drive signals, and transmit the drive signals to the LCD panel 302. The LCD panel 302 would receive the drive signals and operate the pixel array thereof to generate a visual representation of the image corresponding to the received image data.

The LCD panel 302 includes a thin-film transistor (TFT) array substrate 304, a color filter substrate 310 coupled to the TFT array substrate 304, and a liquid crystal layer 312 disposed between the TFT array substrate 304 and the color filter substrate 310. The TFT array substrate 304 and the color filter substrate 310 can both be formed of glass. The LCD panel 302 also includes a plurality of TFT pixels 306 formed on the TFT array substrate 304 between the TFT array substrate 304 and the color filter substrate 310.

The driver IC 314 is configured for receiving image data that is sent to the display module 300, converting the received image data to LCD drive signals, and transmitting the LCD drive signals to the TFT pixels 306 so that the LCD panel 302 will display an image corresponding to the received image data.

The driver cavity 308 can be located outside the perimeter of the LCD panel 302 as shown in FIG. 3, which shows the driver cavity 308 located between the LCD panel 302 and the FPC 324. The LCD module 300 can be thought of as having a display area, which corresponds to the LCD panel 203 portion that generates an image, and a non-display area, which is everything else. From this perspective, the location of the driver cavity 308 in the illustrated embodiment can be designated as being in a non-display area because it is located outside the outer perimeter of the LCD panel 302.

The driver cavity 308 extends into the TFT array substrate 304 from an upper surface (as oriented in FIG. 3) of the TFT array substrate 304. The upper surface (as oriented in FIG. 3) of the TFT array substrate 304 constitutes an active side of the TFT array substrate 304 as being the same side of the TFT array substrate 304 on which the TFT pixels 306 are formed. Thus, the active side of the TFT array substrate 304 is also the side facing the color filter substrate 310.

In the illustrated embodiment, the driver cavity 308 extends into the TFT array substrate 304 to a cavity bottom. The driver IC 314 is disposed in the driver cavity 308. In some embodiments, such as the illustrated embodiment, the driver IC 314 is adhered in the driver cavity 308 by an adhesive layer 322. The adhesive layer 322 can include any suitable adhesive, for example, using glue or a die attach film (DAF).

In some embodiments, such as the illustrated embodiment, the side walls of the driver cavity 308 are not in direct contact with the driver IC 314. Instead, a gap is provided between side walls of the driver cavity 308 and the driver IC 314. As discussed below, after the driver IC 314 is placed in the driver cavity 308, a redistribution layer (RDL) 320 is formed over the driver IC 314 and on the TFT array substrate 304. The process of forming the RDL 320 begins with the forming of a dielectric layer over the TFT array substrate 304 and driver IC 314, during which the gaps between side walls of the driver cavity 308 and the driver IC 314 are filled with a portion of the dielectric material of the RDL 320.

The driver IC 314 includes an image signal input pad 316 and a driving signal output pad 318. In preferred embodiments, the driver IC 314 is oriented in the driver cavity 308 to allow for ease of access to its input and output pads 316, 318. In some embodiments, the driver IC 314 has its input and output pads 316, 318 on one side, which serves as the interface side of the driver IC 314; also, the side opposite the interface side serves as the non-interface side of the driver IC 314. In such embodiments, it is preferred for the driver IC 314 to be oriented in the driver cavity 308 with the interface side facing up towards the cavity opening and with the non-interface side facing down towards the cavity bottom. This orientation will often allow for the easiest fabrication of electrical connections to and from the driver IC 314.

A redistribution layer (RDL) 320 is formed over the driver IC 314 and on the TFT array substrate 304. In some embodiments, the lower surface of the RDL 320 is in direct contact with the TFT array substrate 304. In some embodiments, the formation of the RDL 320 can begin with organic coating or laminating dielectric material over TFT array substrate 304. During this process, the gaps between side walls of the driver cavity 308 and the driver IC 314 are filled with a portion of the dielectric material. Next, a planarizing process can be performed if desired, for example a chemical mechanical planarizing (CMP) operation can be performed. At this point, the desired process can be completed to form the plurality of TFT pixels 306 and related circuitry on the TFT array substrate 304 for the LCD panel 302. This can include forming RLD connections between the TFT pixels 306 and the driver IC 314.

The RDL 320 can be formed using known RDL formation techniques. For example, the RDL 320 can be formed using a patterning and metal deposition process such as printing, PVD, CVD, sputtering, electrolytic plating, and electroless plating.

The RDL 320 is formed of dielectric material and includes one or more metallic interconnect structures embedded in the dielectric material. The metallic interconnect structures include one or more metallic layers and a plurality of via plug structures that provide for electrical connections as needed throughout the RDL 320. For example, the RDL 320 provides at least one direct electrical connection between the driving signal output pad 318 of the driver IC 314 and at least one of the plurality of TFT pixels 306. It should be noted that some metallic layers and via plug structures in the RDL 320 are omitted in the illustration presented in FIG. 3 for simplicity. The metallic interconnect structures can include one or more layers of Al, Cu, Sn, Ni, Au, Ag, or other suitable electrically conductive material.

A first end of an FPC 324 is electrically and mechanically connected to the driver IC 314 and to the TFT array substrate 304 via respective conductive elements, shown as bumps in FIG. 3. More specifically, one of the bumps electrically and mechanically connects the FPC 324, and plural traces 326 thereof, to the image signal input pad 316 of the driver IC 314; the other one of the bumps mechanically connects the FPC 324 to the TFT array substrate 304. The bumps can be formed of gold (Au) by known Au electroplating techniques.

The FPC 324 can include a base member made of synthetic resin (e.g., polyimide resin) having insulating properties and flexibility. A number of electrical traces (all represented by line 326 are formed on the base member. The first end of the long dimension of the FPC 324 is connected to the driver IC 314 and to the TFT array substrate 304 as described earlier. A second end (distal end) can be connected to a variety of different devices or circuits depending on the application in which the display module 300 is ultimately used.

Figure 4:
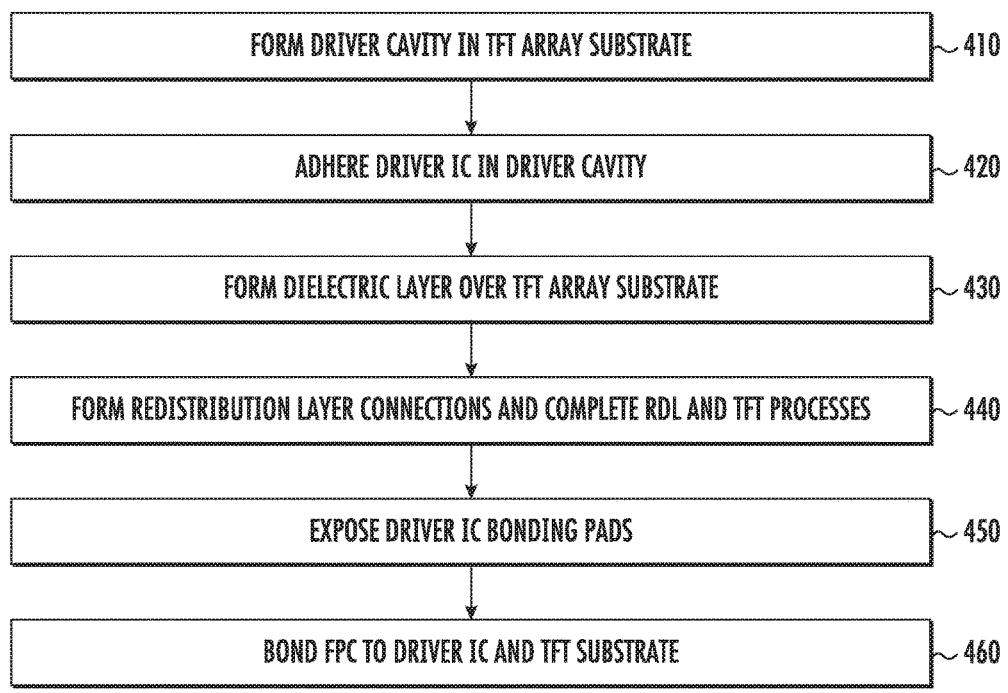
FIG. 4 is a process flow diagram showing an exemplary method for fabricating a display module according to the present disclosure.

FIG. 4 is a process flow diagram showing an exemplary method for fabricating a display module according to the present disclosure. In this embodiment, the method of manufacturing a display module includes a step 410 of forming a driver cavity in a TFT array substrate. The driver cavity can be etched out of the TFT array substrate or otherwise formed according to known processes for etching or laser milling. For example, etch processing can be performed to selectively remove portions of the TFT array substrate to form the driver cavity. Any suitable etch process can be used, including but not limited to: dry etching "Bosch" style, steady state style, cryogenic silicon etch, laser ablation, particle blasting, wet etching, and micro electro discharge machining. Also, the driver cavity can be formed with any desired shape, for example the driver cavity can have a round, oval, square, or rectangular cross-sectional shape.

The step 410 can be a step in a method that includes assembling a liquid crystal display (LCD) panel. In such embodiments, the method can further include forming a thin-film transistor (TFT) array substrate to have both the driver cavity and a plurality of TFT pixels. The driver cavity can include at least one sidewall extending into the TFT array substrate from an active side of the TFT array substrate to a cavity bottom. The method can further include coupling a color filter substrate with the TFT array substrate such that the active side of the TFT array substrate faces the color filter substrate. The method still further can include forming a liquid crystal layer between the TFT array substrate and the color filter substrate.

Next, at step 420, the method can include adhering a driver integrated circuit (driver IC) in the driver cavity. The adhesive layer can include any suitable adhesive, for example, using glue or a die attach film (DAF).

Next, step 430 involves forming a dielectric layer over the active side of the TFT array substrate, followed by forming an RDL and completing TFT processes at step 440. In some embodiments, the forming of the RDL can begin with organic coating or laminating dielectric material over TFT array substrate, which can constitute the forming of the dielectric layer at step 430. After the dielectric layer is formed at step 430, the step can further include planarizing the dielectric layer, for example using a chemical mechanical planarizing (CMP) operation. In some embodiments, the side walls of the driver cavity are not in direct contact with the driver IC. Instead, a gap is provided between side walls of the driver cavity and the driver IC. In such embodiments, the forming of the dielectric layer over the TFT array substrate at step 430 can include at least partially filling the gaps between the driver IC and the side walls of the driver cavity with a portion of the dielectric material.

At step 440, the desired process can be completed to form the plurality of TFT pixels and related circuitry on the TFT array substrate for the LCD panel. This can include forming RLD connections between the TFT pixels and the driver IC. The RDL can be formed using known RDL formation techniques. For example, the RDL can be formed using a patterning and metal deposition process such as printing, PVD, CVD, sputtering, electrolytic plating, and electroless plating. The RDL can be formed of dielectric material and can include one or more metallic interconnect structures embedded in the dielectric material. The metallic interconnect structures can include one or more metallic layers and a plurality of via plug structures that provide for electrical connections as needed throughout the RDL. For example, the RDL can provide at least one direct electrical connection between the driving signal output pad of the driver IC and at least one of the plurality of TFT pixels. Also, the forming of the RDL can include forming the RDL over at least a portion of the interface side of the driver IC. In addition, the forming of electrical connections can include forming one or more electrical connections between the driving signal output pad of the driver IC and at least one of the plurality of TFT pixels. The metallic interconnect structures can include one or more layers of Al, Cu, Sn, Ni, Au, Ag, or other suitable electrically conductive material.

Next, step 450 involves etching away at least a portion of the RDL over the driver IC to expose the image signal input pad and the driving signal output pad.

Finally, step 460 involves attaching a flexible printed circuit (FPC) to the TFT array substrate. In some embodiments, this can include forming at least one metal bump for electrically connecting the image signal input pad of the driver IC to the FPC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display module, comprising:
    a liquid crystal display (LCD) panel, including:
        a thin-film transistor (TFT) array substrate that includes a plurality of TFT pixels, wherein the TFT array substrate defines a driver cavity, and wherein the driver cavity extends from an active side of the TFT array substrate to a cavity bottom; a color filter substrate facing the active side of the TFT array substrate; and a liquid crystal layer disposed between the TFT array substrate and the color filter substrate;
        a driver integrated circuit (driver IC) for driving the LCD panel, wherein the driver IC is disposed in the driver cavity of the TFT array substrate, wherein the driver IC includes an interface side and a non-interface side opposite the interface side, wherein the interface side includes an image signal input pad and a driving signal output pad; and
        a redistribution layer (RDL) on the TFT array substrate, wherein the RDL extends over at least a portion of the driver IC, wherein the RDL provides at least one direct electrical connection between the driving signal output pad of the driver IC and at least one of the plurality of TFT pixels.

2. The display module of claim 1, wherein the display module further comprises a display area and a non-display area, and wherein the driver cavity is located in the non-display area.

3. The display module of claim 1, wherein the driver cavity has one of a round, oval, square, and rectangular cross-sectional shape.

4. The display module of claim 1, wherein the driver IC is positioned in the driver cavity such that the non-interface side of the driver IC faces the cavity bottom.

5. The display module of claim 1, further comprising a layer of adhesive for bonding the driver IC in the driver cavity of the TFT array substrate, wherein at least a portion of the layer of adhesive is disposed between the cavity bottom and the non-interface side of the driver IC.

6. The display module of claim 1, further comprising a flexible printed circuit (FPC) mechanically coupled to the TFT array substrate, wherein the FPC is electrically coupled to the driver IC.

7. The display module of claim 6, wherein the FPC includes a plurality of electrical traces, and wherein at least one of the electrical traces is electrically connected to the image signal input pad of the driver IC.

8. A method of manufacturing a display module, comprising: assembling a liquid crystal display (LCD) panel including:
    forming a thin-film transistor (TFT) array substrate to have a driver cavity and a plurality of TFT pixels, the driver cavity including at least one sidewall extending into the TFT array substrate from an active side of the TFT array substrate to a cavity bottom;
    coupling a color filter substrate with the TFT array substrate such that the active side of the TFT array substrate faces the color filter substrate; and
    forming a liquid crystal layer between the TFT array substrate and the color filter substrate;
    adhering a driver integrated circuit (driver IC) in the driver cavity; and
    forming a redistribution layer (RDL) on the active side of the TFT array substrate, wherein the forming of the RDL includes forming at least one electrical connection between the driver IC and at least one of the plurality of TFT pixels.

9. The method of claim 8, wherein the driver cavity is formed to have one of a round, oval, square, and rectangular cross-sectional shape.

10. The method of claim 8, wherein the driver IC includes an interface side and a non-interface side opposite the interface side;
    wherein the driver IC is positioned in the driver cavity such that the non-interface side of the driver IC faces the cavity bottom; and
    wherein the interface side includes an image signal input pad and a driving signal output pad.

11. The method of claim 10, wherein the forming of the RDL includes forming the RDL over at least a portion of the interface side of the driver IC; and
    wherein the forming of the at least one electrical connection includes forming the at least one electrical connection between the driving signal output pad of the driver IC and at least one of the plurality of TFT pixels.

12. The method of claim 10, wherein the adhering of the driver IC in the driver cavity results in a gap between the driver IC and the at least one sidewall; and
    wherein the forming of the RDL includes depositing a dielectric material over the driver IC and into the gap.

13. The method of claim 12, further comprising etching away at least a portion of the RDL over the driver IC to expose the image signal input pad and the driving signal output pad.

14. The method of claim 13, further comprising attaching a flexible printed circuit (FPC) to the TFT array substrate, including forming at least one metal bump for electrically connecting the image signal input pad of the driver IC to the FPC.

15. A display module, comprising:
 a liquid crystal display (LCD) panel having a plurality of TFT pixels and a thin-film transistor (TFT) array substrate, wherein the TFT array substrate defines a driver cavity that extends into the TFT array substrate from an active side of the TFT array substrate to a cavity bottom;
 a driver integrated circuit (driver IC) for driving the LCD panel, wherein the driver IC is disposed in the driver cavity, wherein the driver IC includes an interface side and a non-interface side opposite the interface side, wherein the interface side includes an image signal input pad and a driving signal output pad; and
 a flexible printed circuit (FPC) electrically coupled to the driver IC, wherein the image signal input pad is arranged to receive image signals from the FPC and the driving signal output pad is arranged to send driving signals to one or more of the plurality of TFT pixels.

16. The display module of claim 15, wherein the driver cavity has one of a round, oval, square, and rectangular cross-sectional shape.

17. The display module of claim 15, wherein the driver IC is positioned in the driver cavity such that the non-interface side of the driver IC faces the cavity bottom.

18. The display module of claim 17, further comprising a layer of adhesive for bonding the driver IC in the driver cavity of the TFT array substrate, wherein at least a portion of the layer of adhesive is disposed between the cavity bottom and the non-interface side of the driver IC.

19. The display module of claim 15, further comprising a redistribution layer (RDL) on the TFT array substrate, wherein the RDL provides at least one direct electrical connection between the driving signal output pad of the driver IC and at least one of the plurality of TFT pixels.

20. The display module of claim 19, wherein the FPC includes a plurality of electrical traces, and wherein at least one of the electrical traces is electrically connected to the image signal input pad of the driver IC.

* * * * *